(12) United States Patent
Bayerer et al.

(10) Patent No.: US 7,724,065 B2
(45) Date of Patent: May 25, 2010

(54) DESATURATION CIRCUIT FOR AN IGBT

(75) Inventors: Reinhold Bayerer, Warstein (DE); Uwe Jansen, Werl (DE); Marco Bohllaender, Schoenheide (DE)

(73) Assignee: Infineon Technologies AG, Neubiberg (DE)

( * ) Notice: Subject to any disclaimer, the term of this patent is extended or adjusted under 35 U.S.C. 154(b) by 121 days.

(21) Appl. No.: 11/534,045

(22) Filed: Sep. 21, 2006

(65) Prior Publication Data

US 2007/0070567 A1    Mar. 29, 2007

(30) Foreign Application Priority Data

Sep. 21, 2005    (DE) ................. 10 2005 045 099

(51) Int. Cl.
*H03K 17/04* (2006.01)
(52) U.S. Cl. .............. 327/375; 327/108; 327/110; 327/111; 327/112; 327/176; 326/82; 326/83; 326/89; 326/90; 323/289
(58) Field of Classification Search ............... 327/375
See application file for complete search history.

(56) References Cited

U.S. PATENT DOCUMENTS

| | | | | |
|---|---|---|---|---|
| 4,949,213 A | * | 8/1990 | Sasagawa et al. | 361/91.4 |
| 5,210,479 A | * | 5/1993 | Kimura et al. | 318/727 |
| 5,396,117 A | * | 3/1995 | Housen et al. | 327/480 |
| 6,545,452 B2 | * | 4/2003 | Bruckmann et al. | 323/289 |
| 6,882,196 B2 | * | 4/2005 | Yee et al. | 327/175 |
| 7,119,586 B2 | * | 10/2006 | Hornkamp | 327/108 |
| 7,176,744 B2 | * | 2/2007 | Goudo | 327/434 |

FOREIGN PATENT DOCUMENTS

| | | |
|---|---|---|
| DE | 29 38 122 A1 | 4/1980 |
| DE | 102 06 392 A1 | 9/2003 |
| DE | 44 01 123 | 2/2005 |
| EP | 0 898 811 | 9/2001 |
| JP | 63095726 | 4/1988 |
| JP | 09102735 | 4/1997 |

OTHER PUBLICATIONS

"diode-connected transistor." Academic Press Dictionary of Science and Technology. 1992. CredoReference. Apr. 22, 2008 <http://www.credoreference.com/entry/3096096>.*

* cited by examiner

*Primary Examiner*—Lincoln Donovan
*Assistant Examiner*—John W Poos
(74) *Attorney, Agent, or Firm*—Dicke, Billig & Czaja, PLLC

(57) ABSTRACT

A desaturation circuit for an IGBT is disclosed. In one embodiment, flooding of the component with charge carriers is reduced before the IGBT is turned off.

27 Claims, 15 Drawing Sheets

DESATURATION CIRCUIT FOR AN IGBT

CROSS-REFERENCE TO RELATED APPLICATIONS

This Utility Patent Application claims priority to German Patent Application No. DE 10 2005 045 099.7 filed on Sep. 21, 2005, which is incorporated herein by reference.

BACKGROUND

The invention relates to a desaturation circuit for an IGBT and to a method for desaturating an IGBT.

Insulated-gate bipolar transistors (IGBTs) combine the principle of a bipolar transistor with a wattless driving of a MOS (metal oxide semiconductor) field effect transistor. An electron current is conducted via a lateral or vertical MOS channel for driving the IGBT. This electron current leads to the injection of holes from a pn junction formed at a rear of the IGBT and polarized in the forward direction. As a result, the low conductivity of a voltage-accepting layer can be increased by several orders of magnitude in the turned-on state of the IGBT by injecting an electron hole plasma. When the IGBT is turned off, however, this conductive plasma must be removed from the active zone which is bound to lead to turn-off losses since, during a voltage rise between emitter and collector of the IGBT, a depletion current or part-current for removing the electron hole plasma continues to flow.

In known NPT (non-punch through) IGBTs with planar cell geometry such as IGBT2 by Infineon Technologies, the variation of gate voltage and collector voltage when the IGBT is turned off is determined by the impedance of the gate circuit, by a gate resistance within the driver, series resistances in modules and on the chip and by parasitic capacitances of the IGBT. A reduction in this impedance leads to a quicker discharge of the gate to a Miller plateau; the Miller plateau becomes shorter and the voltage at the collector rises more quickly. This behavior can be influenced within wide ranges by changing the impedance or a magnitude of the gate current in order to produce a corresponding reaction of the IGBT.

IGBTs of the latest IGBT generations with trench cells and field stop, such as e.g., IGBT3 by Infineon Technologies, however, illustrate a behavior which differs from the above behavior. Such IGBTs are characterized by very low on-state values with increased current densities which is achieved by improvements in the charge carrier distributions of electrons and holes. Lower on-state values are achieved by increased flooding of the component with electrons and holes in the conducting state. At the same time, however, the drive characteristics and the controllability of current and voltage variations change particularly when turning off under inductive loads such as in motor drives. The switching behavior is no longer determined by the parasitic capacitances and driver impedances alone. Instead, a voltage rise at the collector when turning off the IGBT can no longer follow the discharge of the gate capacitance when the impedances become smaller which is why the gate is discharged below the Miller plateau, i.e. the gate voltage when load current is flowing. Since the load current continues to flow during this time, it is fed by charge carriers stored in the IGBT. This also determines an increase in the collector voltage by the removal of the charge carriers stored in the IGBT and cannot be accelerated by greater discharge of the gate with lower gate impedance. However, such behavior impedes a delayless feedback of a temporal change in the collector current or overvoltages at the collector since the gate must firstly be charged up to the Miller plateau again until this novel IGBT reacts. In addition, a voltage rise in the IGBT cannot be accelerated which was possible in IGBTs of known prior generations by reducing the gate impedance. However, such acceleration in the voltage rise is desirable for fast switching applications.

To solve the above problems, it is known to increase impedances in the gate circuit of an IGBT to such an extent that it turns off with a slow current drop. Lowering the gate voltage below the Miller plateau was compensated for in this case by means of special gate control circuits in order to provide for a delayless feedback. Current units were limited to low di/dt by suitable adjustments of the IGBT.

EP 0 898 811 B1 describes a method for changing the turn-off behavior of a known IGBT of a generation such as IGBT2. For this purpose, the Miller capacitance is reduced by increasing the collector voltage before the turning off in order to be able to control a subsequent change in time of the collector voltage dV/dt. This is achieved by first reaching the Miller plateau because the delay time to the steeper voltage rise is thus shortened. The collector voltages are set to high voltages such as, for example, 200 V for reducing the Miller capacitance.

DE 102 06 392 A1 proposes a stepped turn-off of the IGBT.

For these and other reasons, there is a need for the present invention.

SUMMARY

One embodiment provides a desaturation circuit for an IGBT. In this embodiment, flooding of the component with charge carriers is reduced before the IGBT is turned off.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

Figure 1:
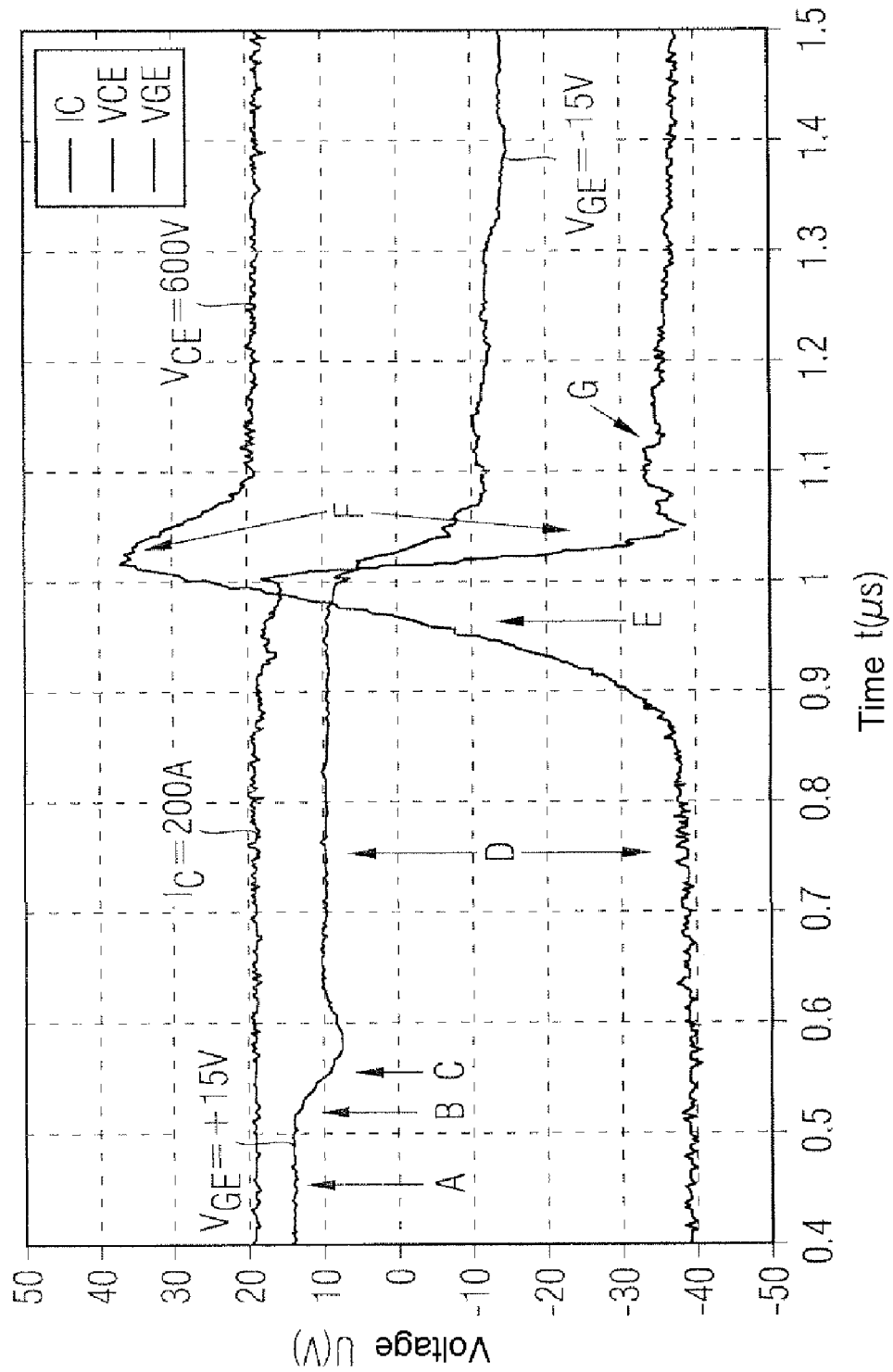
FIG. 1 illustrates signal variations during a turn-off process of an IGBT with planar cell geometry.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

The present invention provides a circuit by means of which the above problems for IGBTs of the latest generation and future generations can be solved and which, in addition, can be achieved in a particularly flexible and easy manner.

According to one embodiment of the invention, a desaturation circuit for an IGBT has a diode and a switch device with a first and a second input/output and a control signal input for turning an electrically conductive connection between the first and the second input/output on and off, wherein the diode and the switch device are connected in series and form elements of a first circuit component which is connected between a gate and a collector of the IGBT and wherein a cathode of the diode is directed toward the collector and an anode of the diode is directed toward the gate. To desaturate the IGBT, the switch device is switched on and thus the diode is connected between gate and collector. Since the voltage at the collector is less than that of the gate during the on state, the gate voltage is lowered until the gate voltage is higher than the collector voltage by an on-state voltage of the diode. In this process, the collector voltage increases correspondingly and the IGBT is desaturated by a reduction of the charge carrier flooding.

In one embodiment, the diode corresponds to a diode-connected active semiconductor component. This can be achieved, for example, by short-circuiting body and source region of an n-channel MOSFET to the anode of the diode. Instead of a MOSFET, for example, a bipolar transistor can also be used by being suitably connected as diode.

In one embodiment, a current-amplifying gate driver circuit is connected in series with the first circuit component as a further circuit component between the first circuit component and the gate. The current-amplifying output stage of the gate driver is thus located, for example, between a coupling point of the diode and the gate of the IGBT. Due to a high internal impedance of the gate driver circuit, the current loading on the diode and that of the switch device of the first circuit component is reduced.

In a further embodiment, a Zener diode is connected in series with the first circuit component as further circuit component between the first circuit component and the gate, wherein the anode of the Zener diode is directed toward the gate and its cathode is directed toward the collector. The Zener diode has the effect that a voltage level for desaturation, i.e. the collector voltage, is raised by a breakdown voltage of the Zener diode. By inserting further voltage-limiting elements such as diodes or semiconductor components operated in the reverse direction into the first or further circuit component, the voltage level for desaturation can be varied and adjusted to desired values. In the case of the Zener diode within the further circuit component, however, it is required that a gate driver voltage is raised by the breakdown voltage of the Zener diode in order to maintain a normal voltage of about 15 V at the gate in the turned-on state of the IGBT.

In a further embodiment, a further circuit component is connected in series with the first circuit component between the gate and the first circuit component, wherein the further circuit component has a series circuit of a current-amplifying gate driver circuit and a Zener diode and an anode of the Zener diode is directed toward the gate and a cathode of the Zener diode is directed toward the collector. This embodiment thus represents a combination of the two embodiments explained above, wherein the corresponding circuit components are connected in series. This embodiment thus enables on the one hand the voltage level for desaturation to be increased by introducing the Zener diode and, on the other hand, the current loading on the switch device and the diode of the first circuit component and the Zener diode to be reduced.

In one embodiment, the current-amplifying gate driver circuit has a first supply voltage terminal for a positive pole of a supply voltage source and a second supply voltage terminal for a negative pole of the supply voltage source and a further switch device is connected between the second supply voltage terminal and a reference point located between the first and further circuit device. Turning on the further switch device switches the voltage at the gate to a negative supply voltage of the gate driver circuit. As a result, the voltage level for desaturation can be adjusted in an accelerated manner at the collector.

Another embodiment has a delay circuit device for delaying the turn-on of the IGBT by a delay time and for delaying the turn-off of the IGBT by the delay time. During the delay time, the IGBT is desaturated. Since the delay time is identical for turn-on and -off, a duty cycle, for example, with a PWM (pulse width modulation) drive of the IGBT is retained. The pulse widths corresponding to a control arrangement are thus reproduced. The delay time thus preferably corresponds with the desaturation period.

In one embodiment, the delay circuit device has a monostable flip-flop for generating the delay during the turn-on and -off of the IGBT. The delay during turn-on and -off is thus effected by the same component. This prevents, when different types of component are used for generating the delay during turn-on and -off, tolerances of these components leading to corruption of the duty cycle due to the fact that the delay times deviate from one another because of component tolerances during turn-on and -off.

In another embodiment, a terminal of an element within the first circuit component is conductively connected to an input terminal of a short-circuit monitoring circuit. The desaturation circuit is thus combined with the short-circuit monitoring circuit and the diode of the first circuit component can be used also for measuring the collector voltage via its function for adjusting the voltage level during the desaturation of the IGBT in that the cathode of this diode is connected to the input terminal of the short-circuit monitoring circuit. The short-circuit monitoring circuit has, for example, a further input terminal for a reference voltage in order to assess whether a short-circuit is present or not by comparing the two input signals.

In a further embodiment, an additional circuit component, having a voltage-limiting element, for limiting the voltage between gate and emitter is connected between a terminal of an element within the first circuit component and the emitter. The switch device of the first circuit component can be used for adding the voltage-limiting element at the gate. However, it is possible to use the desaturation circuit for gradually turning the IGBT off in the case of a short-circuit fault.

The voltage-limiting element is a diode with a breakdown voltage within the range from 10 to 14 V. If it is assumed that the IGBT is operated at a gate voltage of 15 V in the turned-on state, adding the voltage-limiting element by means of the switch device will not lead to an abrupt but to a gradual turning-off of the IGBT when the short-circuit monitoring circuit and desaturation circuit are combined in the event of a short circuit.

One embodiment has a circuit component connected in parallel at least with the first switch device, wherein the parallel-connected circuit component has a series circuit having an additional switch device and an additional Zener diode as circuit elements and the anode of the additional Zener diode is directed toward the collector and its cathode is directed toward the gate. This embodiment is particularly suitable for a desaturation process wherein initially a pre-desaturation can be effected by turning on the additional switch device with the switch device of the first circuit component turned off and then a desaturation can be effected at a higher voltage between collector and emitter by turning off the additional switch device and turning on the switch device of the first circuit component. By changing the polarity of the additional Zener diode, the desaturation is effected with the aid of the parallel-connected circuit component at lower voltage between collector and emitter compared with the desaturation with the aid of the first circuit component. Instead of the additional Zener diode, a different component from the former can also be used as long as this has voltage-limiting characteristics like a Zener diode.

A further additional circuit component, having a further voltage-limiting element, for limiting the voltage between the gate and an emitter of the IGBT is connected between a terminal of a circuit element within the parallel-connected circuit component and the emitter. The further additional switch device of the parallel-connected circuit component can be used for adding the further voltage-limiting element at the gate. However, it is possible to utilize the desaturation circuit for turning off the IGBT gradually in the case of a short-circuit fault.

The further voltage-limiting element is a diode with a breakdown voltage in the range of 10 to 14 V. If it is assumed that the IGBT is operated at a gate voltage of 15 V in the turned-on state, adding the further voltage-limiting element by means of the additional switch device does not lead to an abrupt but to a gradual turning-off of the IGBT in the case of a short-circuit when the short-circuit monitoring circuit and desaturation circuit are combined.

A further embodiment of a desaturation circuit according to the invention for an IGBT includes a PID control circuit for controlling a voltage between a collector and an emitter of the IGBT to a particular nominal value, wherein an output of the PID control circuit is connected to a gate driver circuit for driving the gate and an input of the PID control circuit is connected to an output of a comparison circuit, wherein the comparison circuit is connected at a first one of its inputs to an output of a voltage measuring device for measuring a voltage at the collector and at a second one of its inputs to a reference voltage source outputting the particular nominal value. The PID control circuit is thus used for adjusting the collector voltage for desaturation by controlling the gate voltage. A deviation between a collector voltage measured with the aid of the voltage measuring device from the nominal voltage value is supplied to the PID control circuit and is used for controlling the gate voltage. Both the measured collector voltage and the nominal voltage value can be supplied as divided voltage values.

The desaturation circuit has a switch device for short-circuiting the reference voltage source. If the IGBT is operated in the on state, the reference voltage source is short-circuited via the switch device and the PID control circuit controls the gate voltage to a particular maximum value which is adjusted in accordance with a nominal gate voltage in the on state. The switch device switches in the reference voltage source at the beginning of desaturation and at the end of desaturation, when the IGBT is intended to be cut off, to a maximum reference voltage which is far above the possible actual values. As a result, the gate is switched to a minimum (negative) gate voltage for the OFF state of the IGBT.

The desaturation circuit is accommodated on an integrated circuit which has two semiconductor chips coupled via a coreless transformer. Timing systems and switch devices for desaturation, short-circuit monitoring and multi-stage turning-on or -off are accommodated in the integrated circuit. The output stages used are push-pull emitter followers with complementary bipolar transistors, possibly in Darlington connection or push-pull source followers with complementary power MOSFETs. When MOSFETs are used, transistor types with a low threshold voltage (logic-level MOSFETs) are preferred. The output stages are also accommodated in an integrated circuit. The integrated circuits are designed in such a manner that no gate resistance is needed between the IGBT and the gate driver circuit.

In one embodiment of a method for desaturation, the switch device is turned on for desaturation and remains turned off outside a desaturation period.

In this arrangement it is advantageous to determine first energy losses due to an increased collector voltage during the desaturation before the turn-off in dependence on the desaturation period and second energy losses during the turn-off in dependence on the desaturation period of a preceding desaturation and to establish the desaturation period for the desaturation during the operation of the IGBT at a value at which a sum of first and second energy losses is minimal. The first and second energy losses are preferably determined experimentally but can also be determined by simulation. On the basis of the first and second energy losses, the desaturation period can thus be optimized with regard to minimum turn-off losses.

It is advantageous if a presaturation is carried out at a voltage between collector and emitter within the range from 5 V to 8 V for a period within the range from 2 to 15 µs by turning on the additional switch device and turning off the switch device, whereafter the additional switch device is turned off and the switch device is turned on for a period within the range from 0.1 to 10 μs. In this process, the turn-off losses can be optimized further by 3-stage desaturation. The desaturation stage following the desaturation at low voltages between collector and emitter in the range from 5 to 8 V can have voltages between collector and emitter in the range from approximately 10 to 100 V.

It is also advantageous to keep the desaturation circuit active during an entire conduction phase of the IGBT. Thus, for example, the switch device of the first circuit component is turned on in the turned-on state of the IGBT. Desaturation during the entire conduction phase of the IGBT can be considered, in particular, in the case of high-frequency switching at 20 kHz and higher or, respectively, also with short pulse widths of the PWM. This achieves an operating mode which keeps the IGBT out of saturation right from the start and minimizes switching losses.

Preferably, with increasing load current of the IGBT, a magnitude of the collector voltage is reduced during the desaturation and/or the desaturation period is reduced. In the case of an inverter, this means that, for example, the particular nominal value of the reference voltage source of a PID control circuit is varied cosinusoidally if an output current of the inverter is sinusoidal. Adaptation to a current magnitude thus enables the IGBT to be optimized in terms of its turn-off losses with regard to each current magnitude.

When a short-circuit is detected, during turning-off of the IGBT, a voltage at the gate is applied for a period within the range from 100 ns to 10 μs with a value within the range from 10 to 14 V, before the desaturation is carried out. Thus, a delayed turn-off of the IGBT is effected on occurrence of a short-circuit. For this purpose, a potential of an element within the first circuit component is supplied to an input of a short-circuit monitoring circuit for the detection of a short-circuit.

When a short-circuit is detected, for turning off the IGBT the switch device of the first circuit component is turned on. The gate voltage can be limited via the voltage-limiting element and reduced for the gradual turning-off with respect to a gate voltage in the turned-on state of the IGBT.

It is advantageous to carry out the processes initiated on detection of a short-circuit in the two above sections with each turning-off process. This is possible since a reduction in the gate voltage during the turning-off process within a range from 10 to 14 V with the aid of, e.g., a voltage-limiting element does not bring with it any significant increase in the losses during the turning-off process.

The reference voltage source for the PID control circuit is advantageously short-circuited by the switch device in the conduction phase of the IGBT during a conduction phase of the IGBT outside a desaturation period and switched to a maximum value lying above possible actual values of the voltage between collector and emitter during a cut-off phase of the IGBT.

FIG. 1 is used to provide a general understanding of the invention and illustrates a variation with time of signals during a turn-off process of an IGBT2 of a known IGBT generation with planar cell geometry. In time range "A", a voltage at the driver output is changed from +15 V to −15 V for initiating the turn-off process (not shown). A gate voltage $V_{GE}$ present at the IGBT internally in the module is illustrated. Resulting from a potential difference with respect to the gate of the IGBT, a current flow occurs out of the gate which begins to discharge an input capacitance, i.e. the Miller capacitance between the gate and the collector and the gate-emitter capacitance (see "B" along the curve of the gate-emitter voltage $V_{GE}$). Depending on the magnitude of this gate current, the IGBT changes from a saturation to an edge of the active area in the family of curves. During this phase, the gate voltage drops to the value of the Miller plateau $V_{Miller} = I_c/g_{fs} + V_{th}$, where $I_c$ is a load current between the collector and emitter of the IGBT and $g_{fs}$ is a transfer slope (see "C"). During this process, the collector voltage rises minimally and assumes the value resulting from the initial family of curves, taking into consideration the flowing load current and the value of the Miller plateau. This is only slightly above the saturation voltage between collector and emitter. If the gate voltage $V_{GE}$ is at the Miller plateau (see "D"), the collector voltage rises by such an amount that a polarity between gate and collector becomes repolarized.

The voltage between emitter and collector $V_{CE}$ rises to values in the range from approximately 10 to 15 V. During this process, a constant gate current $I_G = dV_{CE}/dt \, C_{GC}(V_{GC})$ flows. If the starting point of the voltage rise $dV_{CE}/dt$ at the beginning of the Miller plateau is defined as $V_{GC} = 0$ V, the Miller capacitance $C_{GC}$ indicates a greatly non-linear dependence on the voltage $V_{GC}$ of the form $C_{GC} \sim 1/V_{GC}$. The greatly nonlinear dependence of the Miller capacitance on the voltage $V_{GC}$ stems from a voltage-dependent widening of the space charge zone between gate and collector. Since, however, the voltage across the Miller capacitance $C_{GC}$ is low in the turned-on state, a large charge must be taken from it in order to achieve a small voltage difference.

During the Miller plateau, $V_{GE}$ is constant in first approximation. The capacitance between gate and emitter thus does not play a role in this time range since no current is taken from this capacitance due to the constant gate voltage during the Miller plateau. In the range identified by "E", the gate voltage is still at the Miller plateau but, as the discharge state of the Miller capacitance progresses, it decreases greatly and the voltage between collector and emitter $V_{CE}$ can rise all the faster. The IGBT is now completely in the active range. The voltage between gate and emitter $V_{GE}$ drops minimally to the voltage which is obtained in the initial family of curves with an instantaneous voltage between collector and emitter $V_{CE}$ and load current $I_C$. The change with time of the voltage between collector and emitter $dV_{CE}/dt$ is only limited by the speed at which the parallel circuit of the capacitances between gate and collector $C_{GC}$ and between gate and emitter $C_{GE}$ is discharged which is determined by the magnitude of the gate discharge current $I_G$ and thus indirectly by a negative driver voltage and a gate resistance $R_G$. Since the IGBT turns off an inductive load, the load current $I_C$ at the IGBT can only drop when another current path is available. Such a further current path is provided by a freewheeling diode. However, the further current path through the diode requires a rise in the collector voltage $V_{CE}$ until the freewheeling diode is polarized in the forward direction. Such an overvoltage is generated by the IGBT in that the latter begins to turn off the load current $I_C$.

The collector current $I_C$ is proportional to the voltage between gate and emitter $V_{GE}$. The current change $dI_c/dt$ generates a correspondingly large overvoltage on unavoidable parasitic inductances, which is present at the IGBT. During this process, the load current $I_C$ is commutated to the diode. A current change on the IGBT is taken over by the freewheeling diode. The drop in load current $I_C$ in conjunction with the overvoltage at the collector is illustrated in section "F". The process of drop in the load current $I_C$ in the IGBT is limited by the speed with which the input capacitance between gate and emitter $C_{GE} + C_{GC}$ is discharged and with which the voltage between gate and emitter $V_{GE}$ or the threshold voltage drops. This is thus another dependence on the discharge current $I_G$ of the gate.

However, since $I_G$ is determined by the voltage difference between the driver output and the gate of the IGBT and the impedance between them and this voltage difference decreases with increasing discharge state, an irreducible minimum time is required for this. This limits the change in load current with time in the IGBT. The variation of the gate voltage $V_{GE}$ and the variation of the collector voltage $V_{CE}$ of this IGBT of a known generation is thus determined by the impedance of the gate circuit and parasitic capacitances in the IGBT. The turn-off behavior of such an IGBT can thus be varied within wide ranges by varying the impedance of the gate circuit. Apart from this, a tail current still continues to flow thereafter which is caused by the residual charge stored in the IGBT and decays with time which is illustrated in the range identified by "G".

Figure 2:
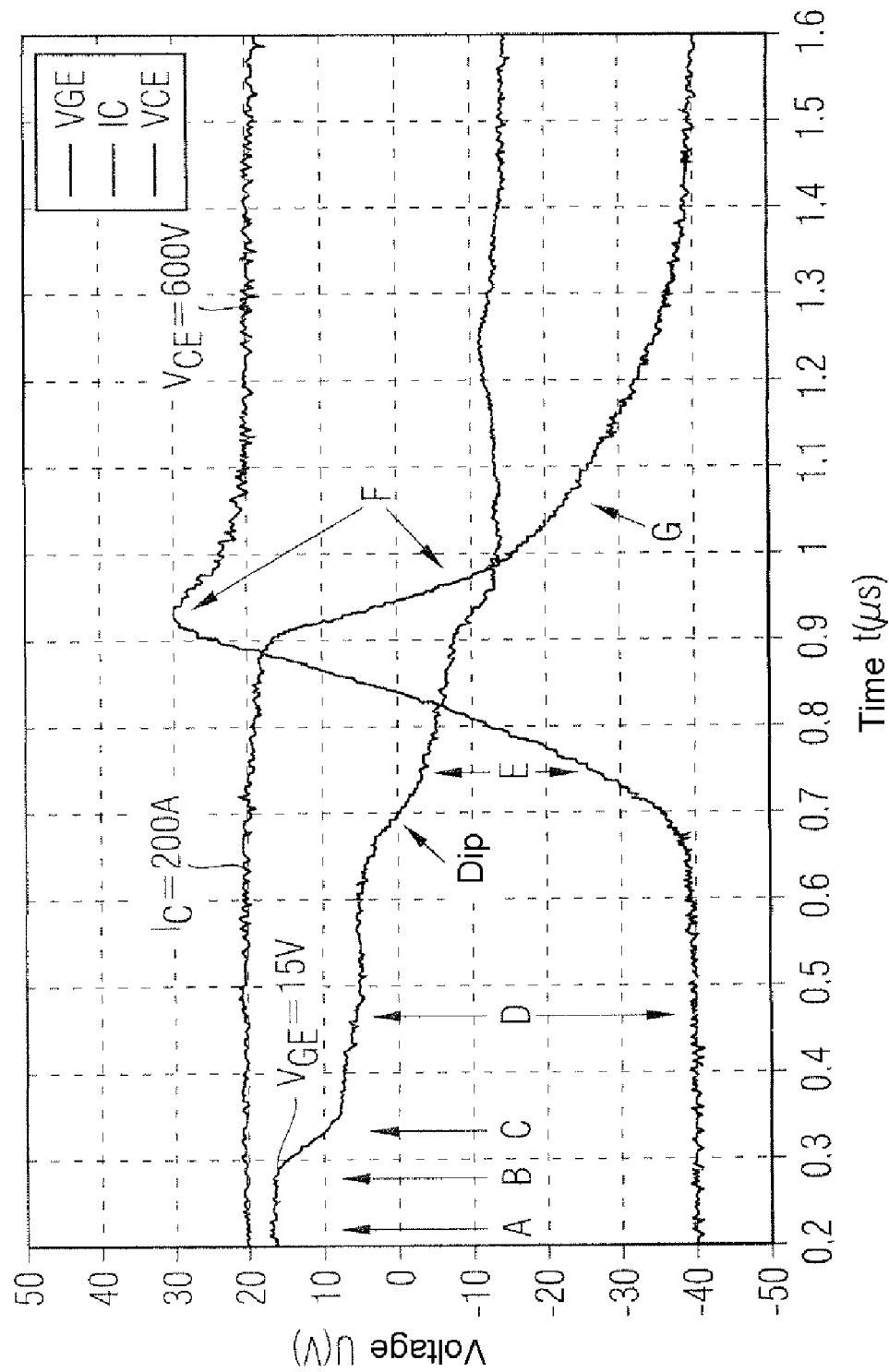
FIG. 2 illustrates signal variations during a turn-off process of an IGBT of the latest generation with trench cells and field stop.

Like FIG. 1, FIG. 2 illustrates signal variations on turning-off an IGBT. In contrast to FIG. 1, however, the turn-off behavior is illustrated for an IGBT of the latest IGBT generation with trench cells and field stop. In the text which follows, essential differences in the switching behavior of this novel IGBT in comparison with the turn-off behavior of a known IGBT are explained. At the end of the Miller plateau, identified by "D", a drop in gate voltage $V_{GE}$ can be observed in the range identified by "dip", although the load current $I_C$ continues to flow in unchanged magnitude. The drop in gate voltage $V_{GE}$ below the Miller plateau can be explained by the fact that as the gate impedance of the latest IGBT generations becomes less, the voltage rise at the collector $V_{CE}$ can no longer follow the discharge of the capacitances $C_{GC}$ and $C_{GE}$ on turn-off. Since, however, the load current $I_C$ continues to flow undiminished during the time of the dip at the end of the Miller plateau, it is fed by charge carriers stored in the IGBT. The rise in collector voltage $V_{CE}$ is also determined by the removal of stored charge carriers within the IGBT and cannot be accelerated by an increased discharge of the gate, e.g., with reduced gate impedance. This results in the disadvantages explained in the introductory part of the present application, such as delayless feedback of di/dt of the load current $I_C$ or overvoltages at the collector. Thus, the turn-off behavior of IGBTs of the latest generation can no longer be explained by parasitic capacitances and impedances in the gate circuit alone.

Figure 3:
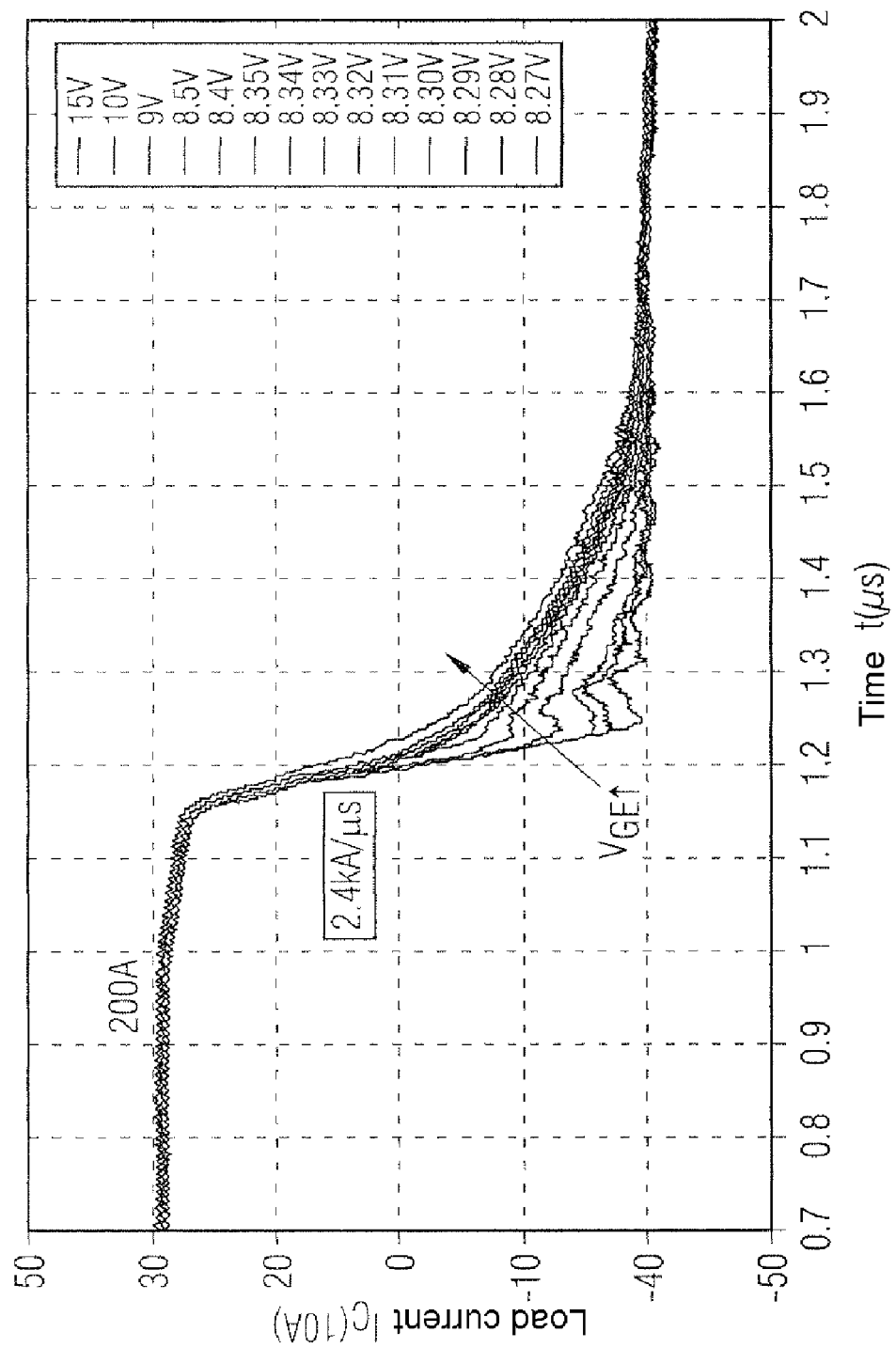
FIG. 3 illustrates a variation of a load current with time on turn-off in dependence on the voltage level of the desaturation.

FIG. 3 illustrates load current variations during turn-off of the IGBT with the gate voltage during the desaturation as parameters for the set. The desaturation produces a reduction in the charge carrier concentrations of electrons and holes within the IGBT. The form of the tail current (compare also the area "G" in FIGS. 1 and 2) with a drop in the load current $I_C$ illustrated can be reduced for the gate voltage with decreasing values in the voltage range illustrated. A reduction in the tail current produces a reduction in the turn-off losses of the IGBT.

Figure 4:
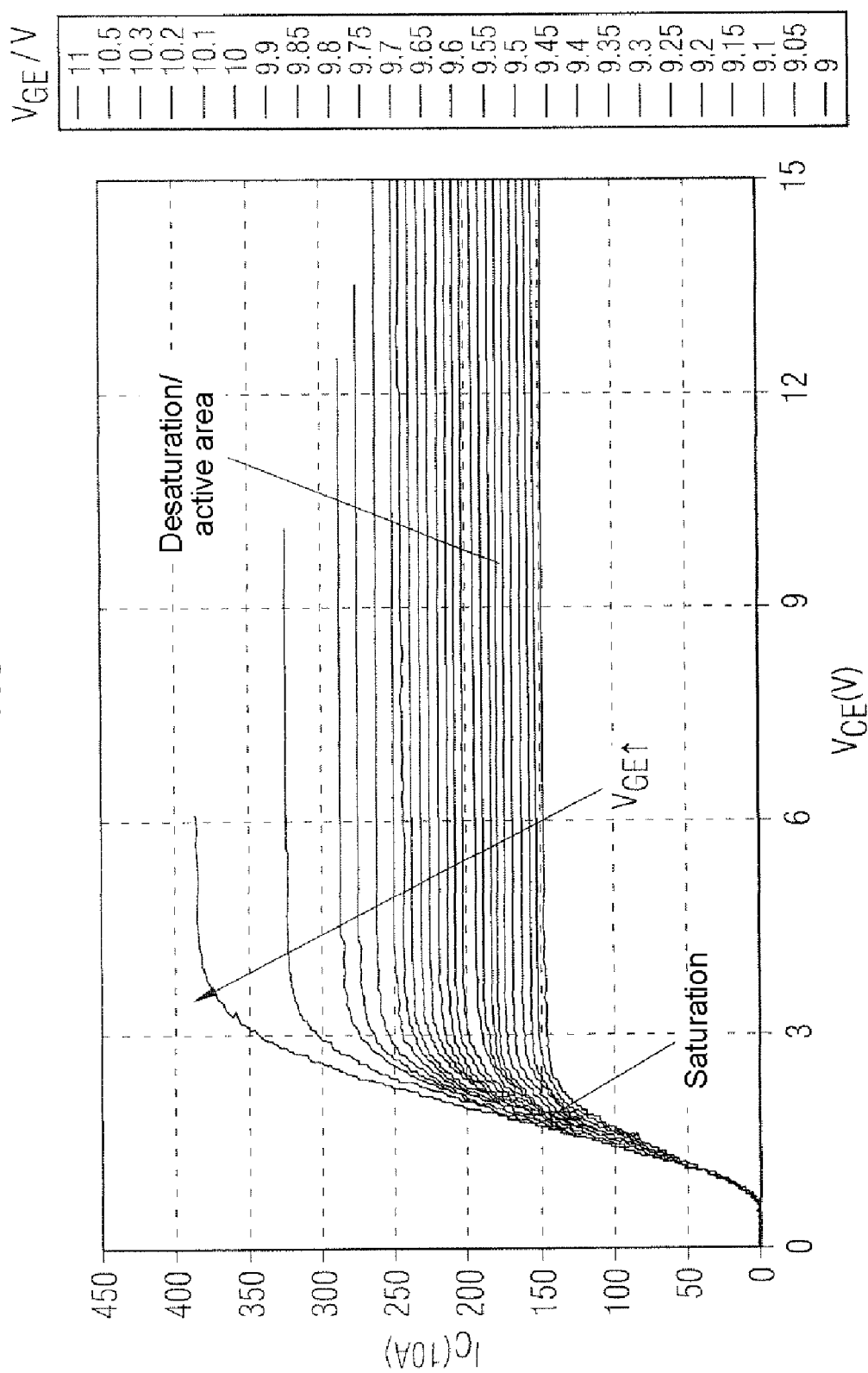
FIG. 4 illustrates an initial steady-state family of characteristics of an IGBT of the latest generation.

FIG. 4 illustrates an initial steady-state family of characteristics of an IGBT3 of the latest IGBT generation with trench cells and field stop. A current between collector and emitter $I_C$ is plotted against a voltage between collector and emitter $V_{CE}$. The voltage between gate and emitter $V_{GE}$ is used as parameter for the set. In the area of saturation, the collector current $I_C$ changes approximately linearly with an increase in the collector voltage $V_{CE}$. With collector voltages $V_{CE}$>3 V, the IGBT changes into desaturation or into the active area before saturating. In this area, the collector current $I_C$ is almost constant. There is only a slight increase in the collector current $I_C$ with an increase in $V_{CE}$.

Figure 5:
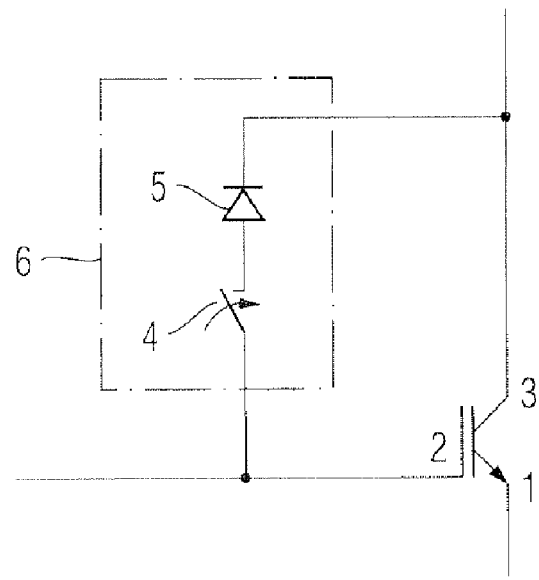
FIG. 5 illustrates a first embodiment of a desaturation circuit for an IGBT.

FIG. 5 illustrates a diagrammatic equivalent circuit of a first embodiment of a desaturation circuit for an IGBT. The IGBT has an emitter 1, a gate 2 and a collector 3. Between gate 2 and collector 3 of the IGBT, a switch device 4, illustrated diagrammatically, and a diode 5 are connected in series. The cathode of the diode 5 is connected to the collector 3. The switch device 4, illustrated simplified, can be implemented, for example, as a MOSFET or bipolar transistor. Diode 5 and switch device 4 form elements of a first circuit component 6. If the IGBT is in the on state before desaturation, the switch 4 is opened. For the desaturation, the switch 4 is closed and a Miller capacitance formed between gate 2 and collector 3 discharges via the diode 5. During this process the collector voltage $V_{CE}$ present at the collector 3 rises until the gate voltage is higher than the collector voltage $V_{CE}$ by a forward voltage of the diode 5. Typical values of the collector voltage $V_{CE}$ occurring in this process are about 8 V at nominal current according to the initial family of curves of the IGBT (compare also FIG. 4). This first embodiment represents a desaturation circuit which can be implemented in a very simple manner.

Figure 6:
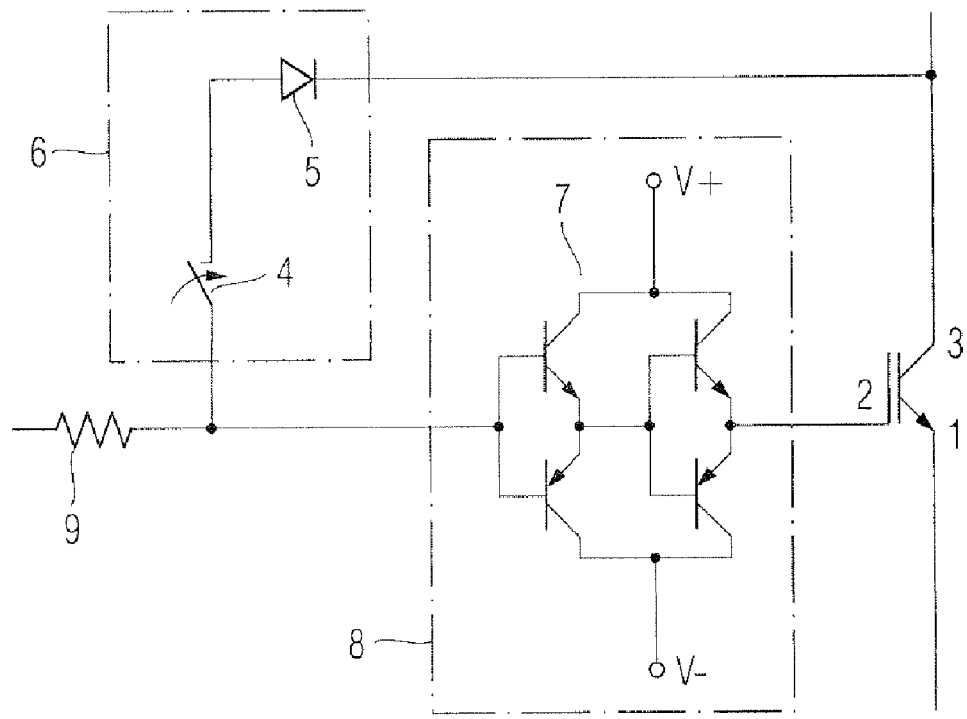
FIG. 6 illustrates a second embodiment of a desaturation circuit for an IGBT.

FIG. 6 illustrates a diagrammatic equivalent circuit of a second embodiment of a desaturation circuit for an IGBT. In addition to the first circuit component 6 illustrated in FIG. 1, a current-amplifying gate driver circuit 7, which forms a further circuit component 8, is connected in series with the first circuit component 6 in this second embodiment. During the discharge of the Miller capacitance between gate 2 and collector 3 when the switch device 4 is closed, a discharge current thus does not exclusively flow via the diode 5 and switch device 4 but additionally via the current-amplifying gate driver circuit 7. Since the latter, however, has a higher internal impedance in comparison with the diode 5, the maximum current load on the switch device 4 and on the diode 5 drops. A gate resistor 9 is illustrated as further element of a gate drive circuit.

Figure 7:
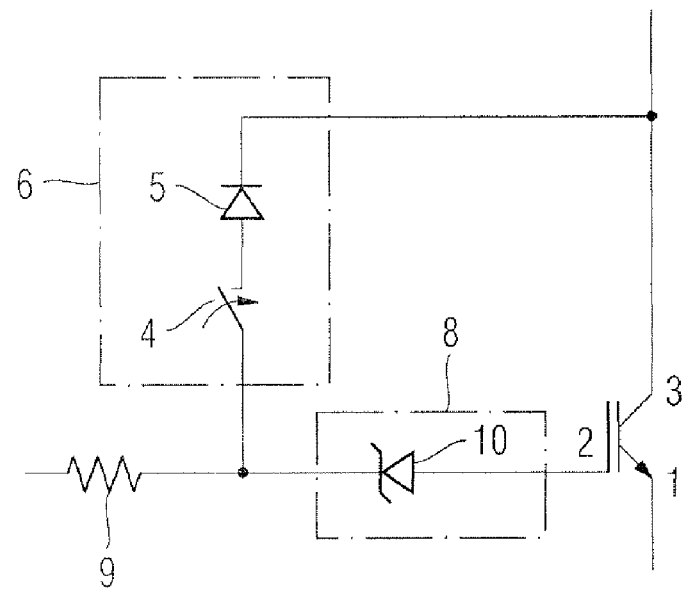
FIG. 7 illustrates a third embodiment of a desaturation circuit for an IGBT.

FIG. 7 illustrates a diagrammatic equivalent circuit of a third embodiment of a desaturation circuit for an IGBT. Apart from the first circuit component 6 already described in the first two embodiments, this embodiment has a Zener diode 10 in series with the first circuit component as further circuit component 8 between the first circuit component 6 and the gate 2. The anode of the Zener diode 10 is directed to the gate 2 and its cathode is directed to the collector 3. The Zener diode increases the voltage level of the desaturation by a Zener voltage compared with the voltage level of desaturation due to the first and second embodiments illustrated in FIGS. 5 and 6. It must be noted that a gate driver voltage must provide a voltage which is higher by the Zener voltage compared with a conventional driver voltage of e.g., 15 V. This third embodiment is thus used for increasing the voltage level during desaturation, i.e. for increasing the collector voltage $V_{CE}$ during the desaturation.

Figure 8:
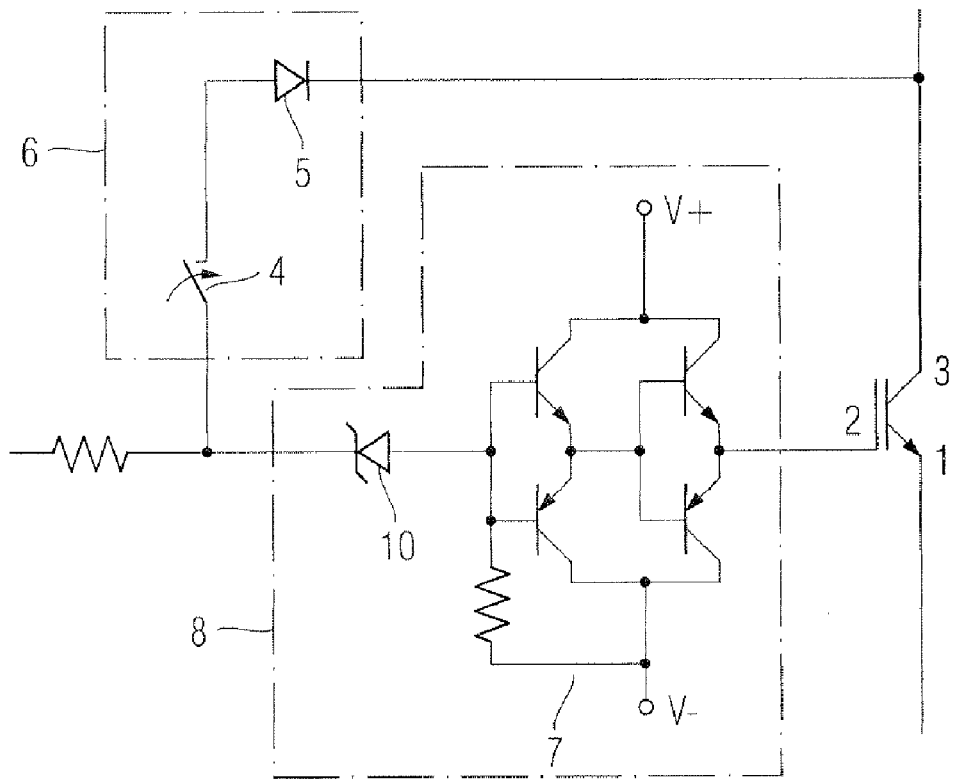
FIG. 8 illustrates a fourth embodiment of a desaturation circuit for an IGBT.

FIG. 8 illustrates a diagrammatic equivalent circuit of a fourth embodiment of a desaturation circuit for an IGBT. This fourth embodiment combines the Zener diode 10 arranged in the third embodiment illustrated in FIG. 7 and the current-amplifying gate driver circuit 7 arranged in the second embodiment illustrated in FIG. 6 in a further circuit component 8, i.e. both the current-amplifying gate driver circuit 7 and the Zener diode 10 are connected in series with the first circuit component 6. This embodiment thus offers the possibility, on the one hand, of not loading the diode 5, the switch device 4 and the Zener diode 10 too much with current due to the impedance of the current-amplifying gate driver circuit 7 by closing the switch device 4 during desaturation, and of raising the voltage level of desaturation above the Zener diode 10.

Figure 9:
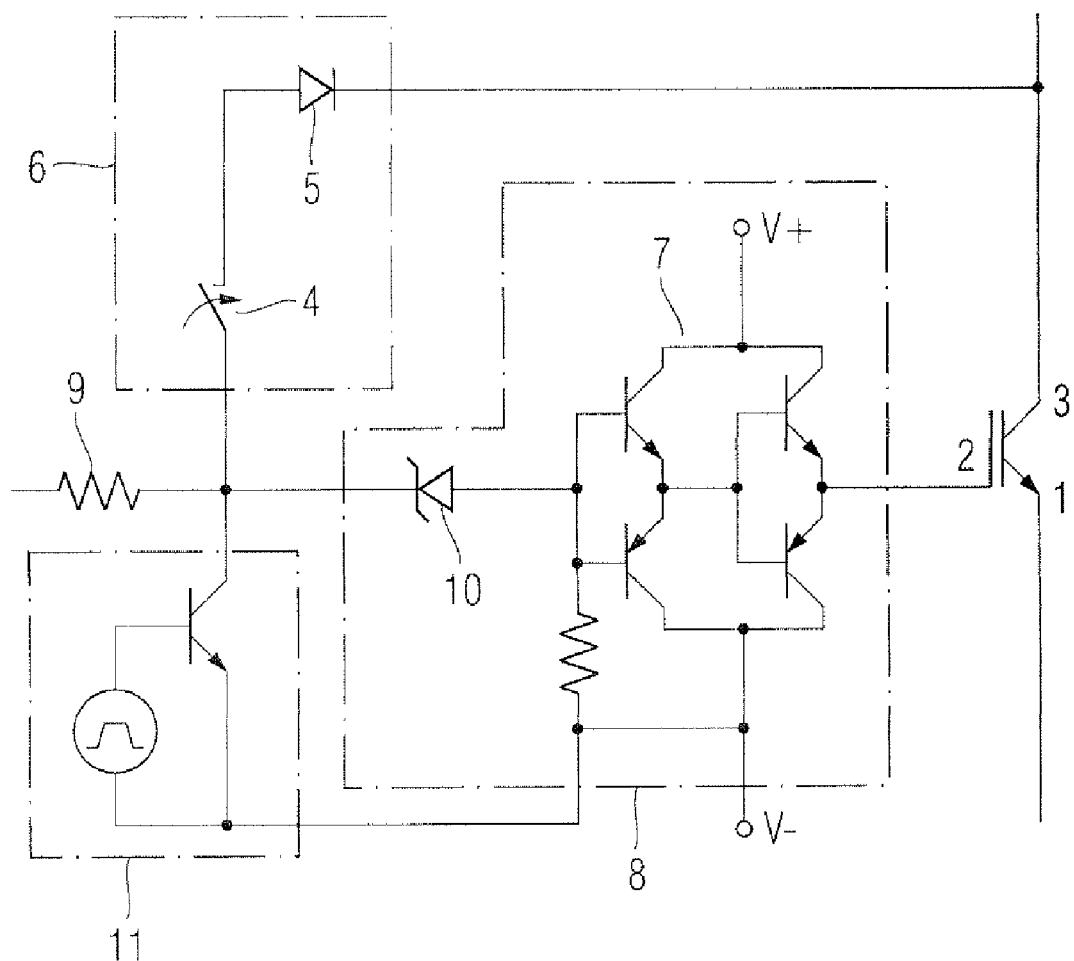
FIG. 9 illustrates a fifth embodiment of a desaturation circuit for an IGBT.

FIG. 9 illustrates a diagrammatic equivalent circuit of a fifth embodiment of a desaturation circuit for an IGBT. This embodiment corresponds to the fourth embodiment illustrated in FIG. 8 with regard to the first circuit component 6 and the further circuit component 8. Supplementary to the fourth embodiment, the fifth embodiment of the desaturation circuit, however, has a further switch device 11 between a second supply voltage terminal V_ of the current-amplifying gate driver circuit 7 and a reference point located between the first and further circuit device 6, 8. The further switch device 11 is used, in particular, for switching gate 2 for a short time to the negative pole of the supply voltage terminal V_ of the current-amplifying gate driver circuit 7. As a result, the voltage level for desaturation at the collector is reached more quickly. The further switch device 11 is constructed as bipolar transistor with drivable base signal. However, this is one of many possibilities for implementing the further switch device 11. For example, it can also be constructed as MOSFET.

Figure 10:
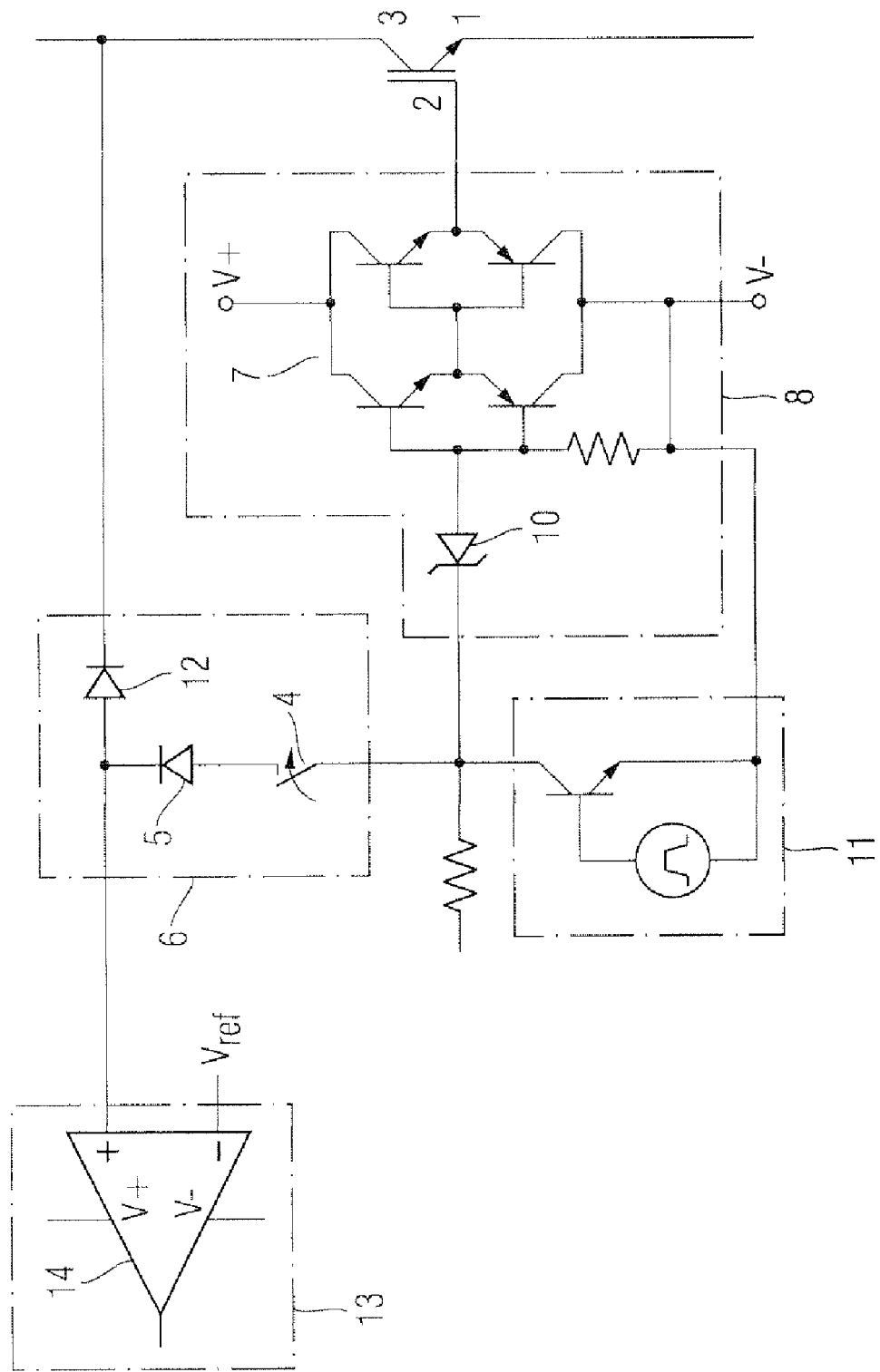
FIG. 10 illustrates a sixth embodiment of a desaturation circuit for an IGBT.

FIG. 10 illustrates a diagrammatic equivalent circuit of a sixth embodiment of a desaturation circuit for an IGBT. Corresponding to the fifth embodiment illustrated in FIG. 9, the desaturation circuit has the first circuit component 6, the second circuit component 8 and the further switch device 11. It is only within the first circuit component 6, that the sixth embodiment has an additional further diode 12 connected in series with the diode 5 in the same direction. In addition, the desaturation circuit is coupled to a short-circuit monitoring circuit 13. A potential of the cathode of the diode 5 is conducted to an input of a comparator 14 of the short-circuit monitoring circuit 13 as actual voltage signal. To assess whether a short-circuit of the load is present or not, the actual voltage signal is compared with a reference voltage $V_{ref}$ in the comparator 14 and an output signal of the comparator 14 is used, for example, for turning off the IGBT. The desaturation circuit of the sixth embodiment can thus be used for short-circuit monitoring.

Figure 11:
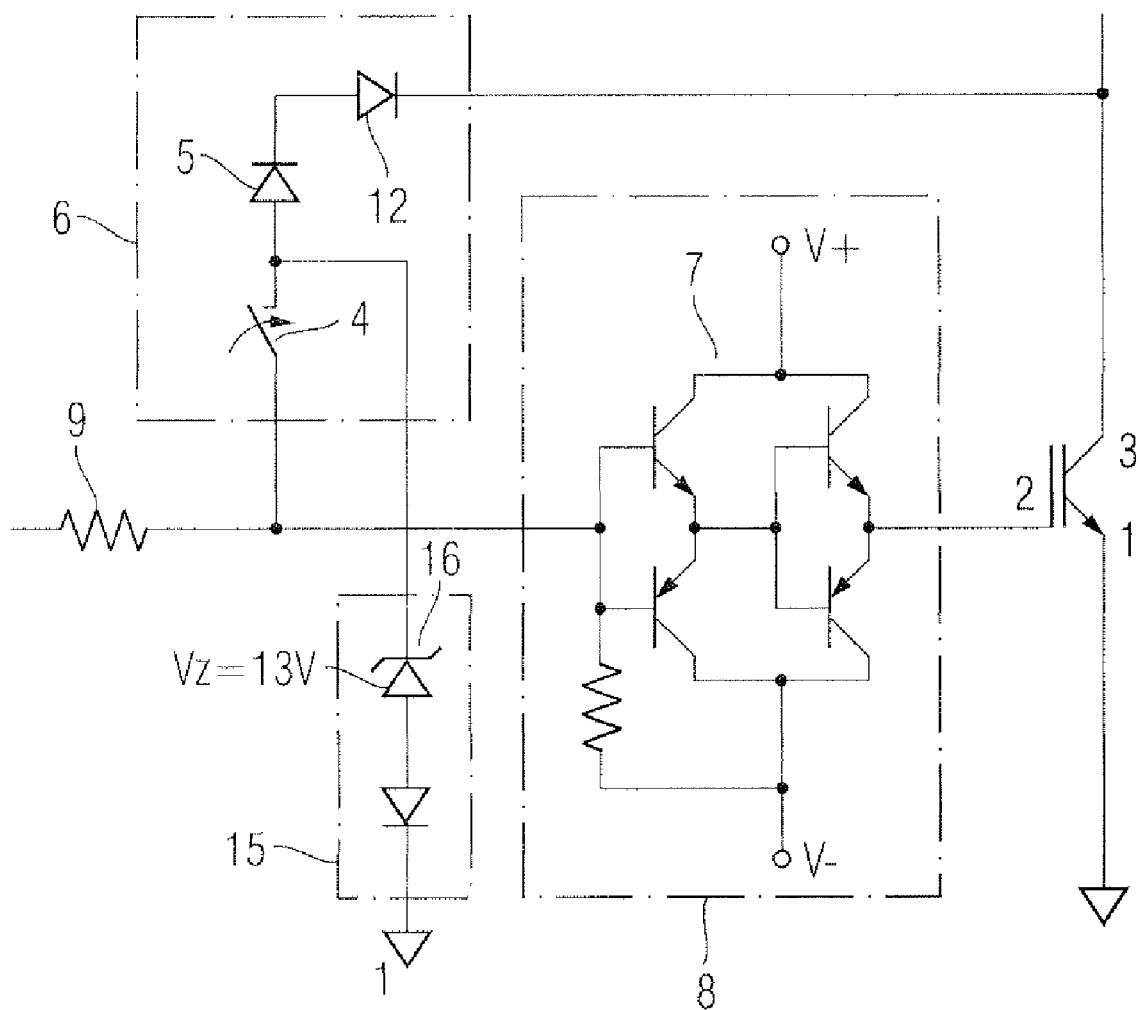
FIG. 11 illustrates a seventh embodiment of a desaturation circuit for an IGBT.

FIG. 11 illustrates a diagrammatic equivalent circuit of a seventh embodiment of a desaturation circuit for an IGBT. Corresponding to the second embodiment illustrated in FIG. 6, the seventh embodiment has, connected in series from the gate 2 to the collector 3, the current-amplifying gate driver circuit 7, the switch device 4, the diode 5 and beyond these the further diode 12. In addition, this desaturation circuit is characterized by an additional circuit component 15 for voltage limiting between the gate 2 and the emitter 1. The additional circuit component 15 is connected between the emitter 1 and the anode of the diode 5. A Zener diode is used as voltage-limiting element 16 within the additional circuit component 15. The switch device 4 can then be used for turning off the IGBT when a short-circuit is detected. If a short-circuit is detected, the switch device 4 closes and the voltage at the gate 2 is limited by the voltage-limiting element 16. The latter limits the voltage to 13 V as illustrated so that when a short-circuit is detected, a voltage normally present at the gate in the range of 15 V is reduced to 13 V according to the voltage-limiting element 16. The seventh embodiment thus provides for an extremely flexible use of the desaturation circuit both for desaturation before turn-off of the IGBT and for reducing the voltage at gate 2 on detection of a short-circuit.

Figure 12:
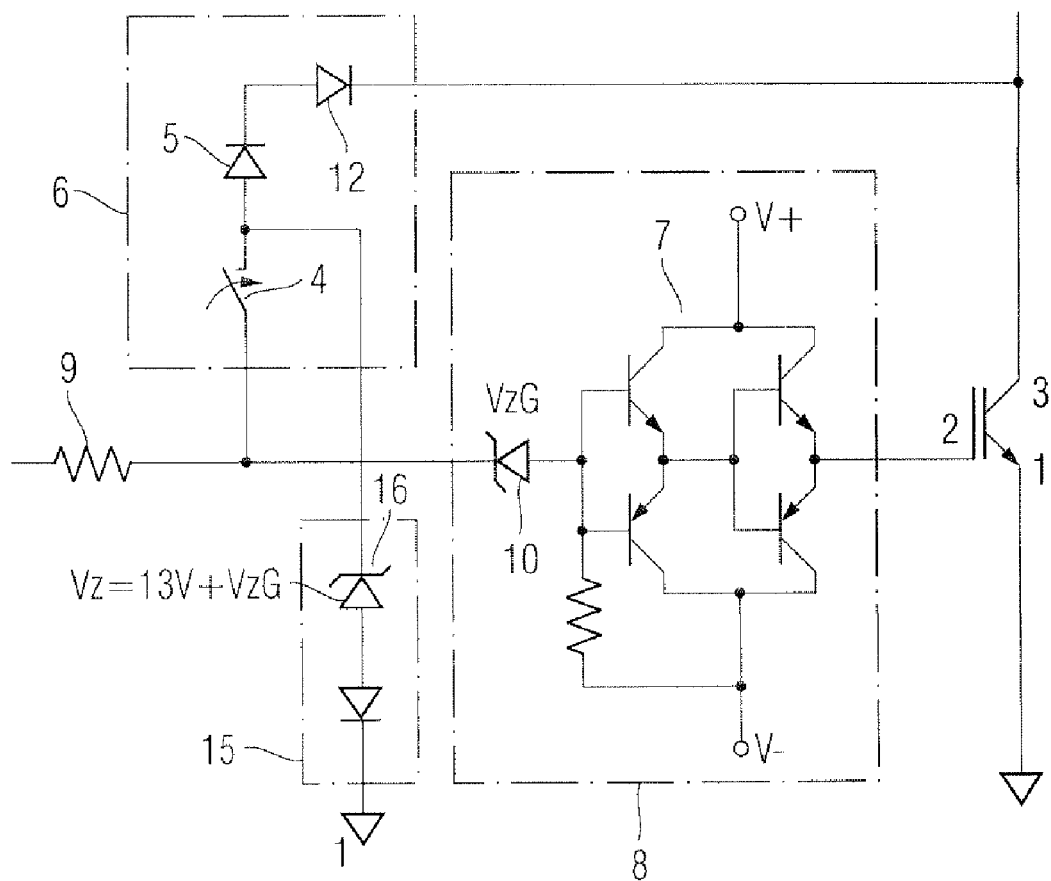
FIG. 12 illustrates an eighth embodiment of a desaturation circuit for an IGBT.

FIG. 12 illustrates a diagrammatic equivalent circuit of an eighth embodiment of a desaturation circuit for an IGBT. This embodiment differs from the seventh embodiment illustrated in FIG. 11 only in that the further circuit component 8, in addition to the current-amplifying gate driver circuit 7, additionally has the Zener diode 10 connected in series. In order to further limit the voltage at gate 2 to 13 V in the case of a short-circuit, the voltage-limiting element 16 has a voltage limitation to $V_z = 13V + V_{zG}$, wherein the voltage $V_{zG}$ specifies a breakdown voltage of the Zener diode 10.

Figure 13:
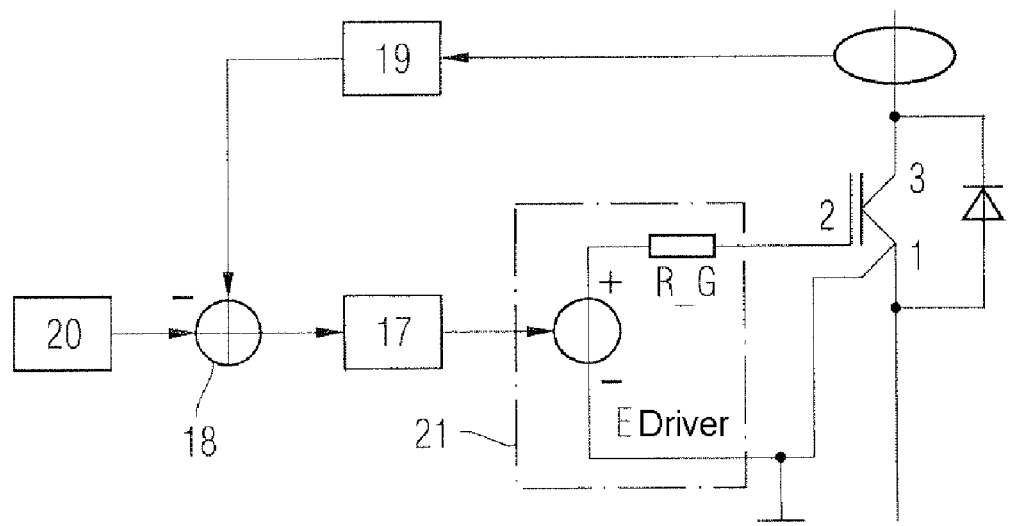
FIG. 13 illustrates a ninth embodiment of a desaturation circuit for an IGBT.

FIG. 13 illustrates a diagrammatic equivalent circuit of a ninth embodiment of a desaturation circuit for an IGBT. A PID control circuit 17 is used here for controlling a voltage at the gate 2 of the IGBT until a certain nominal value of a desaturation voltage is achieved at the collector 3. To control the voltage at the gate 2, the PID control circuit 17 uses a signal from a comparison circuit 18 which is supplied with a voltage value of the collector voltage via a test voltage device 19 and, on the other hand, the nominal value provided by a reference voltage source 20, for determining the signal. If the voltage at the collector is too low during the desaturation, the PID control circuit 17 reduces the voltage at the gate 2 by driving a driver circuit 21 illustrated simplified as controllable voltage source via an output. Due to the decrease in voltage at the gate 2, the voltage at the collector 3 rises until it reaches the nominal value. If the IGBT is in the on state, the reference voltage source 20 is short-circuited and thus supplies a nominal value of 0 V at the input of the comparison circuit 18. In this case, the PID control circuit increases the voltage at gate 2 up to a maximum value which usually corresponds to a known gate voltage of about 15 V during operation. This embodiment can be used, in particular, for especially advantageously adjusting desaturation voltages above 30 V without having to increase a supply voltage of the driver circuit 21 to disadvantageously high values.

Figure 14:
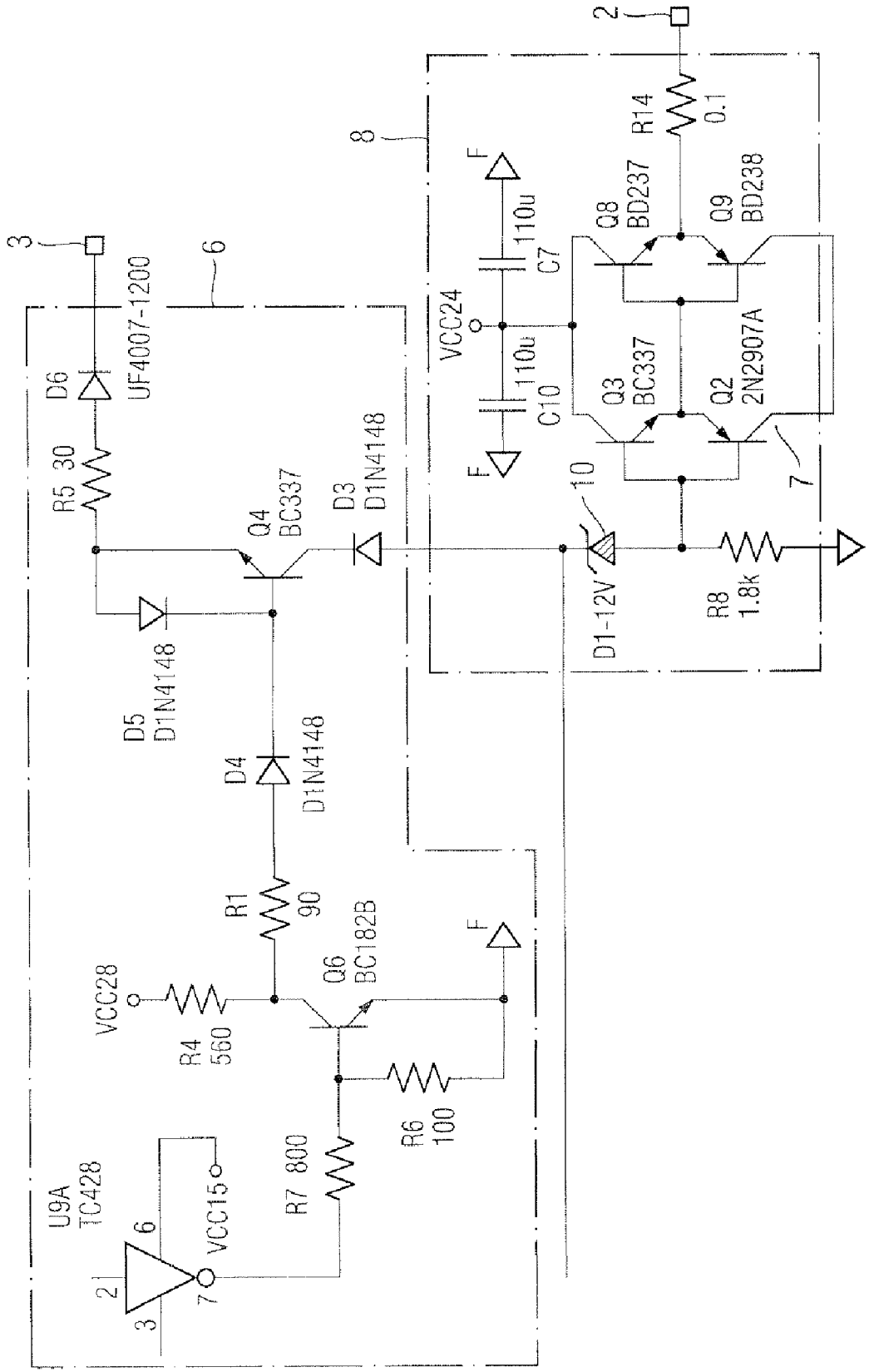
FIG. 14 illustrates an exemplary equivalent circuit of an embodiment of a desaturation circuit for an IGBT.

FIG. 14 illustrates an example of an embodiment of a desaturation circuit as equivalent circuit. Apart from the diodes D3 and D6, the first circuit component 6 has a bipolar transistor Q4 as switch device which, via a drive circuit (U9A), receives a turn-on signal for initiating desaturation shortly before the IGBT is turned off. The cathode of the diode D6 is connected to the collector 3 of the IGBT (the collector is diagrammatically identified by the reference symbol 3). The further circuit component 8 which, on the one hand, has the Zener diode D1 for increasing the voltage level of desaturation and, on the other hand, has the current-amplifying gate driver circuit 7 for lowering the current load on the switch device Q4 and the diodes D3, D6 and D1, is connected in series with the first circuit component 6. Furthermore, a gate resistor R14 is connected in series with the current-amplifying gate driver circuit 7. The gate resistor R14 is conductively connected to the gate 2 of the IGBT (only identified by the reference symbol 2 like the collector).

Figure 15:
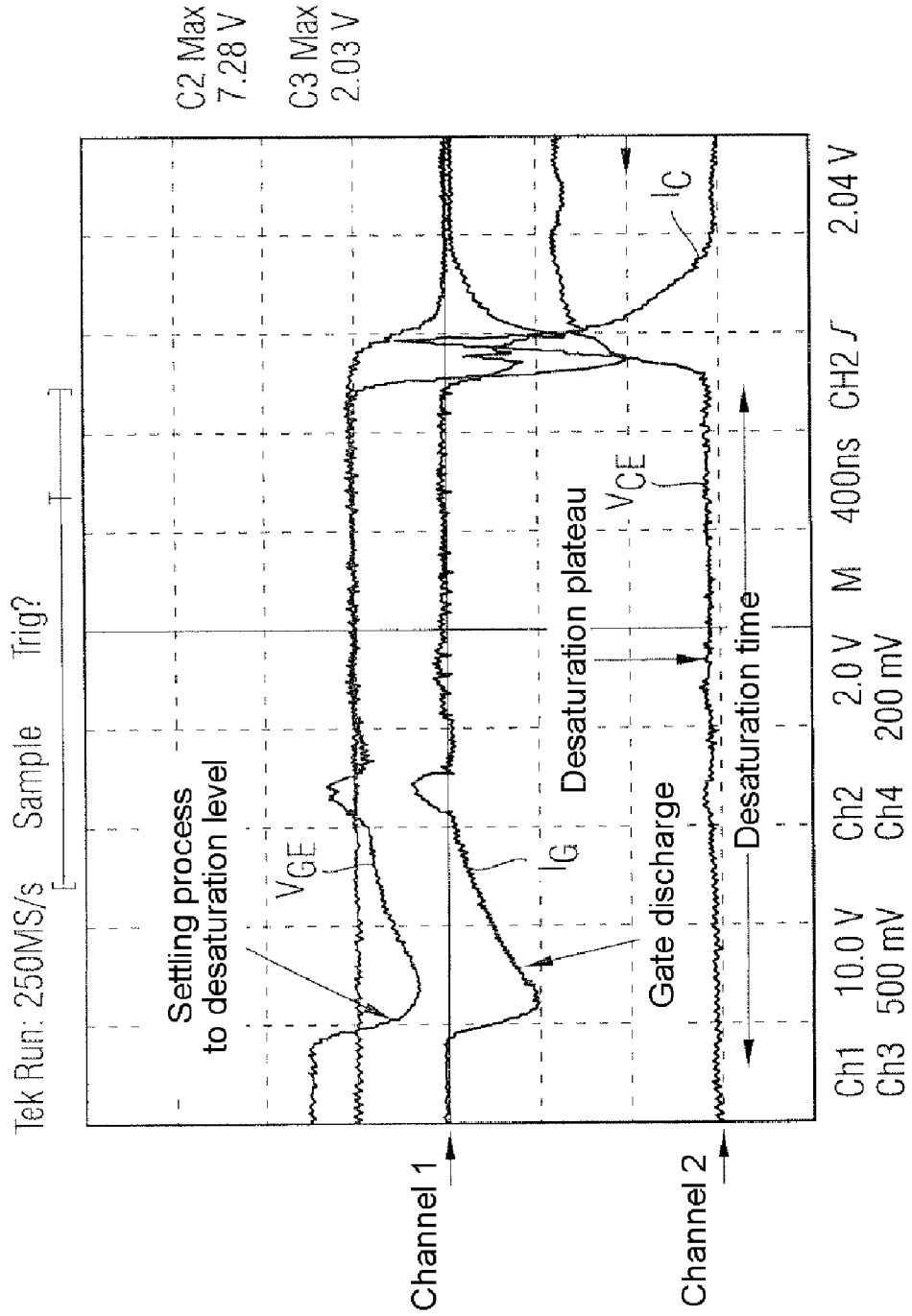
FIG. 15 illustrates signal variations during the desaturation and the turning-off of an IGBT of the latest generation.

FIG. 15 illustrates signal variations with time of load current $I_C$, collector-emitter voltage $V_{CE}$, gate-emitter voltage $V_{GE}$ and gate current $I_G$ of an IGBT of the latest generation during desaturation and turning-off an inductive load with the aid of the embodiment of a desaturation circuit illustrated in FIG. 14. In this arrangement, the gate is discharged with a high current $I_G$ and there is preferably no gate resistor R14 in the gate circuit in the equivalent circuit illustrated in FIG. 14. The gate voltage $V_{GE}$ initially drops below the Miller plateau which is possible due to the charge carriers stored in the IGBT for maintaining a constant load current flow $I_C$. An injection of charge carriers via the MOSFET in the IGBT, which is switched off for a short time during this process, leads to a fast desaturation to a desaturation level of about 20 V. After the desaturation time has elapsed, the load current $I_C$ drops in that the load current is gradually handled by a freewheeling diode, not illustrated in FIG. 14. If the variation of the gate voltage $V_{GE}$ is compared with the gate voltage variation, illustrated in FIG. 2, of an IGBT of the latest generation with a known turn-off mode, it can be seen that the dip during the Miller plateau has disappeared, the collector voltage $V_{CE}$ rises more quickly (one scale unit in FIG. 15 corresponds to 400 ns) and particularly controllably and the tail current is reduced.

Figure 16:
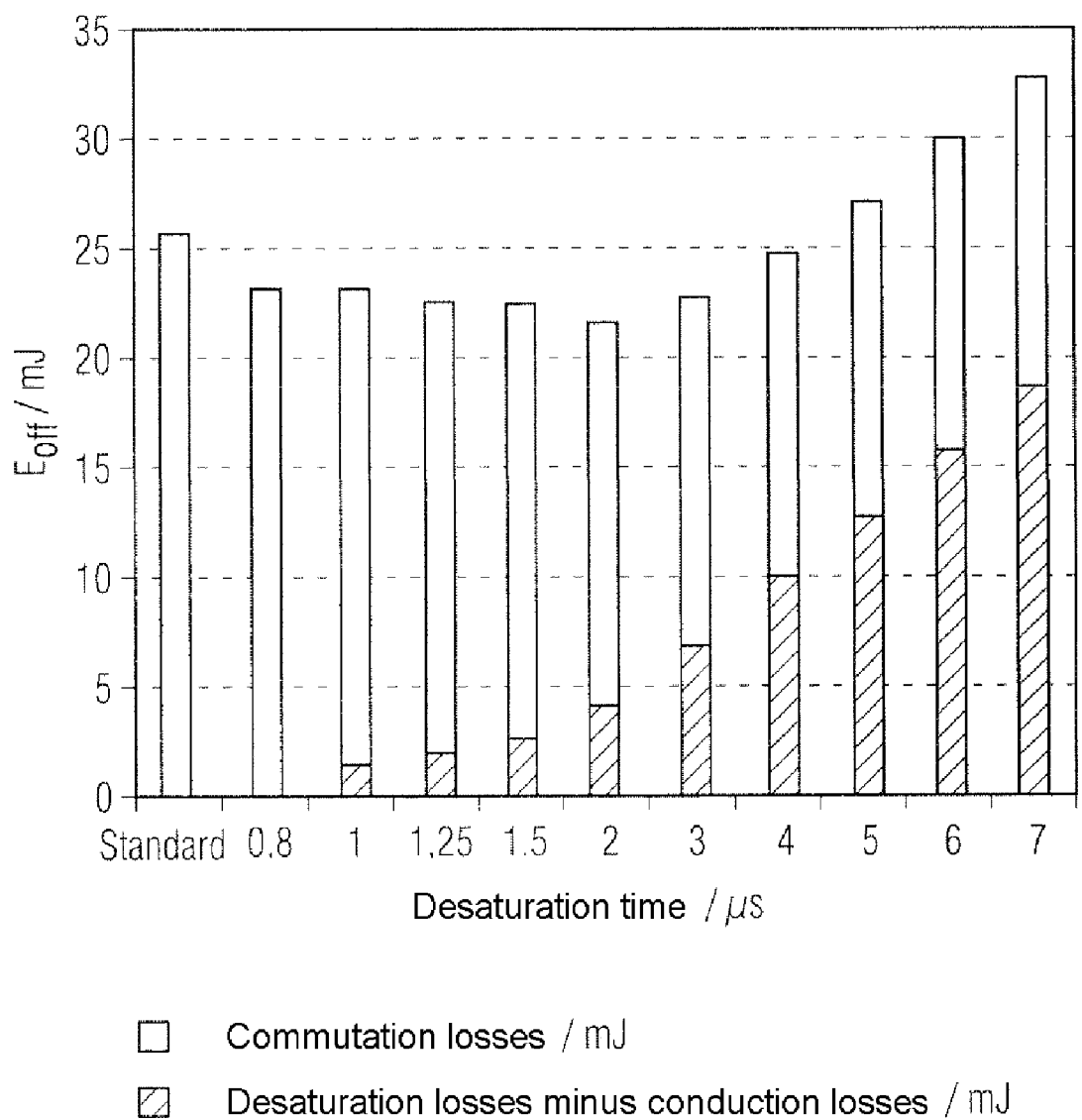
FIG. 16 illustrates a balance of turn-off losses of an IGBT in dependence on a desaturation time.

FIG. 16 illustrates a balance of energy losses during the turn-off process in dependence on the desaturation time with a desaturation level of 20 V taking into consideration conduction losses. A turn-off process without desaturation is illustrated as standard as reference for the desaturation losses. In this context, only commutation losses occur with decreasing load current flow and rising collector voltage. If a desaturation is performed and the desaturation time is increased, desaturation losses occur due to a rise in the collector voltage during the desaturation, apart from the decreasing commutation losses due to the optimized tail current variation. If the two components are added together, a minimum of turn-off losses can be seen at a desaturation time of 2 µs in FIG. 16. The value of the desaturation time for minimum turn-off losses shifts toward different values depending on desaturation level, gate impedance and other parameters. Compared with the standard without desaturation, however, a decrease in losses during the turn-off process can be achieved. For the sake of completeness, it should be mentioned that the measurement of the standard is based on a gate impedance of 3.6Ω and the other measurement values are based on a gate impedance of 0Ω.

Figure 17:
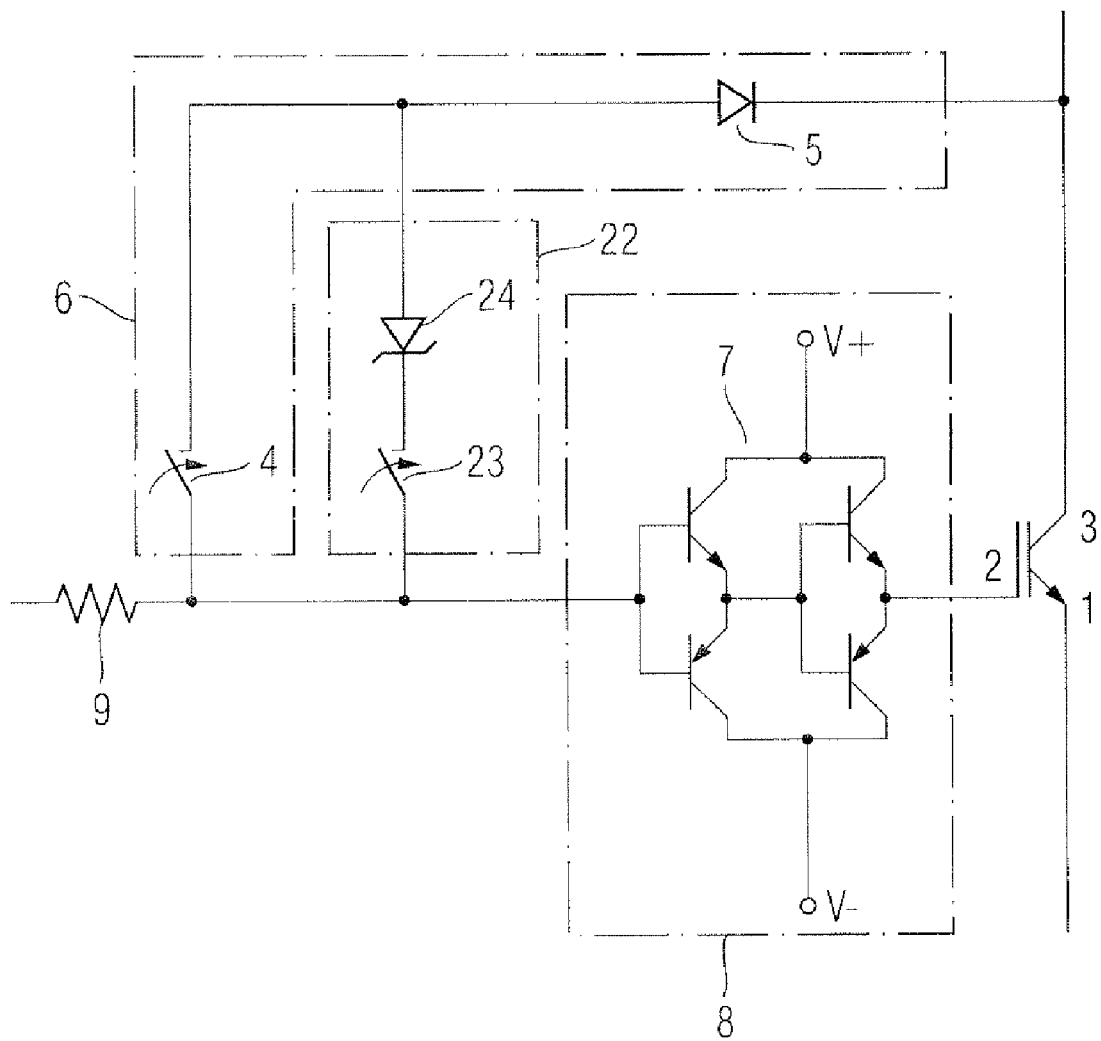
FIG. 17 illustrates a tenth embodiment of a desaturation circuit for an IGBT.

FIG. 17 illustrates a diagrammatic equivalent circuit of a tenth embodiment of a desaturation circuit for an IGBT. In addition to the second embodiment illustrated in FIG. 6, a parallel-connected circuit component 22 consisting of an additional switch device 23 and an additional Zener diode 24 is connected in parallel with the switch device 4 of the first circuit component 6 in this tenth embodiment. The anode of the additional Zener diode 24 is directed toward the collector 3. The parallel-connected circuit component 22 is used for desaturating the IGBT in several processes with different voltages between collector 3 and emitter 1. If, for example, the additional switch device 23 is closed and the switch device 4 is open, the IGBT, due to the direction of polarization of the additional Zener diode 24, desaturates at a lower voltage than in the reverse case with an open additional switch device 23 and closed switch device 4.

Figure 18:
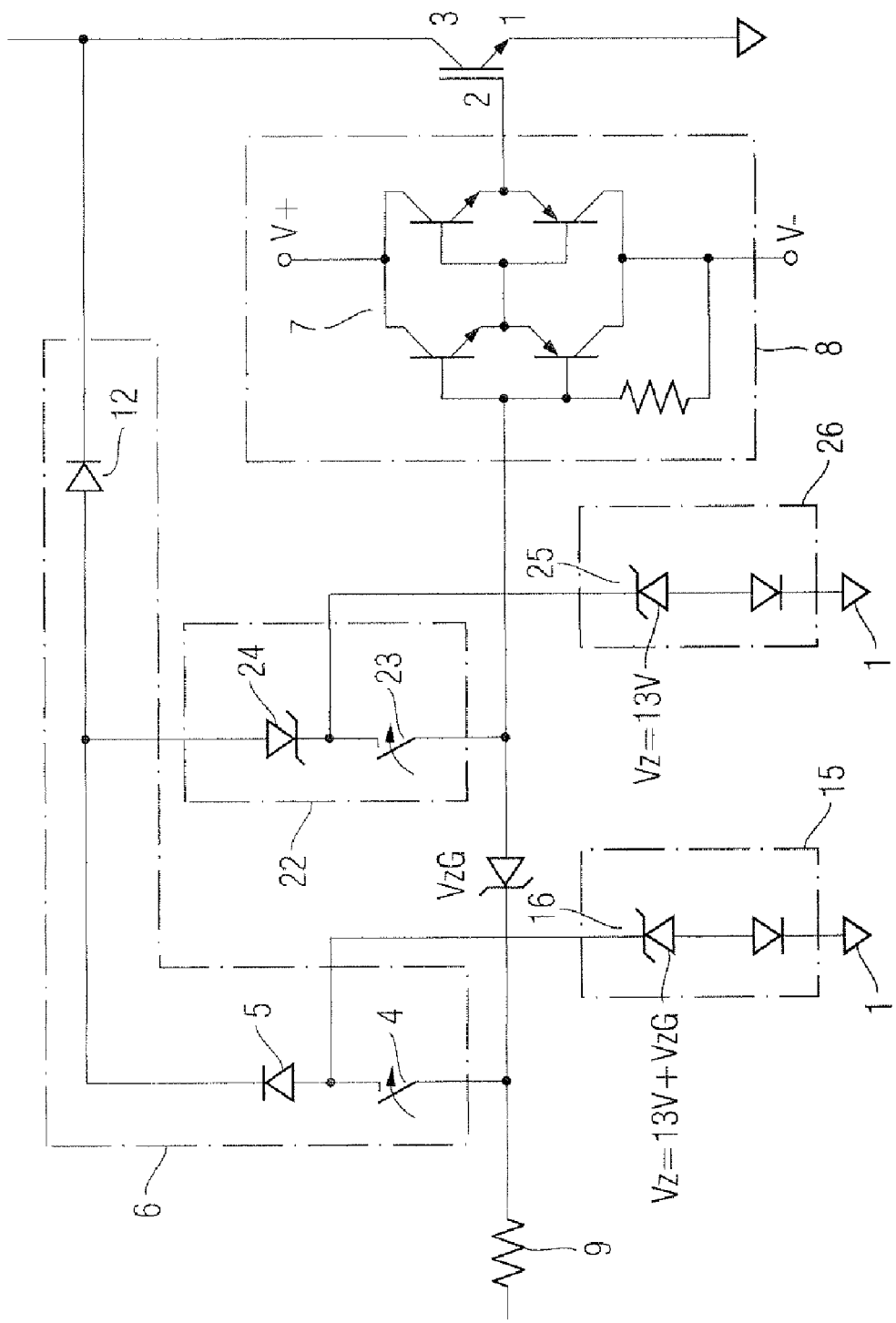
FIG. 18 illustrates an eleventh embodiment of a desaturation circuit for an IGBT.

FIG. 18 illustrates a diagrammatic equivalent circuit of an eleventh embodiment of a desaturation circuit for an IGBT. In addition to the eighth embodiment illustrated in FIG. 12, this embodiment has a parallel-connected circuit component 22 which is connected in parallel with the diode 5 and the switch device 4. Similar to the tenth embodiment illustrated in FIG. 17, the parallel-connected circuit component 22 consists of an additional switch device 23 and an additional Zener diode 24. The anode of the additional Zener diode 24 is directed toward the collector 3. Analogously to the corresponding component of the tenth embodiment, the parallel-connected circuit component 22 is used for desaturating the IGBT in several processes with different voltages between collector 3 and emitter 1. Furthermore, this desaturation circuit is characterized by a further additional circuit component 26 for limiting the voltage between the gate 2 and the emitter 1. The further additional circuit component 26 is connected between the emitter 1 and the cathode of the additional Zener diode 24. A Zener diode is used as a further voltage-limiting element 25 within the further additional circuit component 26. Like the switch device 4 of the first circuit component 6, the additional switch device 23 can be used for turning off the IGBT when a short-circuit is detected (compare also FIG. 12 with associated Figure description).

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A desaturation circuit for an IGBT, comprising:
   a diode;
   a switch device with a first and a second input/output and a control signal input for turning an electrically conductive connection between the first and the second input/output on and off;
   wherein the diode and the switch device are connected in series and form elements of a first circuit component which is connected between a gate and a collector of the IGBT, and a cathode of the diode is directed toward the collector and an anode of the diode is directed toward the gate;
   the switch device being configured to be turned on prior to turn-off of the IGBT to induce desaturation of the IGBT; and wherein a desaturation current flowing from the gate of the IGBT to the collector of the IGBT is passing through the switch device and is turned on and off by the switch device, said desaturation current reducing a gate voltage of the IGBT.

2. The desaturation circuit for an IGBT as claimed in claim 1, comprising wherein the diode is a diode-connected active semiconductor component.

3. The desaturation circuit for an IGBT as claimed in claim 1, comprising wherein a current-amplifying gate driver circuit is connected in series with the first circuit component as a further circuit component between the first circuit component and the gate.

4. The desaturation circuit for an IGBT as claimed in claim 3, comprising:
   wherein the current-amplifying gate driver circuit has a first supply voltage terminal for a positive pole of a supply voltage source and a second supply voltage terminal for a negative pole of the supply voltage source; and
   a further switch device is connected between the second supply voltage terminal and a reference point located between the first and further circuit device.

5. The desaturation circuit for an IGBT as claimed in claim 1, comprising wherein a Zener diode is connected in series with the first circuit component as further circuit component between the first circuit component and the gate, wherein the anode of the Zener diode is directed toward the gate and its cathode is directed toward the collector.

6. The desaturation circuit for an IGBT as claimed in claim 1, comprising:
   wherein a further circuit component is connected in series with the first circuit component between the gate and the first circuit component, wherein the further circuit component has a series circuit of a current-amplifying gate driver circuit and a Zener diode; and
   an anode of the Zener diode is directed toward the gate and a cathode of the Zener diode is directed toward the collector.

7. The desaturation circuit for an IGBT as claimed in claim 1, comprising a delay circuit device for delaying the turn-on of the IGBT by a delay time and for delaying the turn-off of the IGBT by the delay time.

8. The desaturation circuit for an IGBT as claimed in claim 7, comprising wherein the delay circuit device has a monostable flip-flop for generating the delay during the turn-on and -off of the IGBT.

9. The desaturation circuit for an IGBT as claimed in claim 1, comprising wherein an additional circuit component, having a voltage-limiting element, for limiting the voltage between the gate and an emitter of the IGBT is connected between a terminal of an element within the first circuit component and the emitter.

10. The desaturation circuit for an IGBT as claimed in claim 9, comprising wherein the voltage-limiting element is a diode with a breakdown voltage within the range from 10 to 14 V.

11. The desaturation circuit as claimed claim 9, comprising wherein, when a short-circuit is detected, for turning off the IGBT, the switch device of the first circuit component is turned on.

12. The desaturation circuit as claimed in claim 11, comprising wherein the circuit is configured to carry out the processes initiated on detection of a short-circuit with each turning-off process.

13. The desaturation circuit for an IGBT as claimed in claim 1, comprising a circuit component connected in parallel at least with the first switch device, wherein the parallel-connected circuit component has a series circuit of an additional switch device and an additional Zener diode as circuit elements and the anode of the additional Zener diode is directed toward the collector and its cathode is directed toward the gate.

14. The desaturation circuit for an IGBT as claimed in claim 1, comprising wherein a further additional circuit component, having a further voltage-limiting element, for limiting the voltage between the gate and an emitter of the IGBT is connected between a terminal of a circuit element within the parallel-connected circuit component and the emitter.

15. The desaturation circuit as claimed in claim 13, comprising wherein the circuit is configured to carry out a pre-desaturation at a voltage between collector and emitter within the range from 5 V to 8 V for a period within the range from 2 to 15 μs by turning on the additional switch device and turning off the switch device, whereafter the additional switch device is turned off and the switch device is turned on for a period within the range from 0.1 to 10 μs.

16. The desaturation circuit as claimed in claim 1, comprising wherein the desaturation circuit is configured to remain activated during an entire conduction phase of the IGBT.

17. The desaturation circuit as claimed in claim 1, comprising wherein the circuit is configured such that, with increasing load current of the IGBT, a magnitude of the collector voltage is reduced during the desaturation and/or the desaturation period is reduced.

18. A desaturation circuit for an IGBT, comprising:
a diode;
a switch device with a first and a second input/output and a control signal input for turning an electrically conductive connection between the first and the second input/output on and off; wherein:
 the diode and the switch device are connected in series and form elements of a first circuit component which is connected between a gate and a collector of the IGBT, and a cathode of the diode is directed toward the collector and an anode of the diode is directed toward the gate;
 the switch device is being configured to be turned on prior to the turn-off of the IGBT to induce desaturation of the IGBT; and wherein a desaturation current flowing from the gate of the IGBT to the collector of the IGBT is passing through the switch device and is turned on and off by the switch device; and
 wherein a terminal of an element within the first circuit component is conductively connected to an input terminal of a short-circuit monitoring circuit.

19. The desaturation circuit as claimed in claim 18, comprising wherein, when a short-circuit is detected, for turning off the IGBT, the circuit is configured to apply a voltage at the gate for a period within the range from 100 ns to 10 μs with a value within the range from 10 to 14 V, before the desaturation is carried out.

20. A desaturation circuit for an IGBT, comprising:
a diode; and
a switch device with a first and a second input/output and a control signal input for turning an electrically conductive connection between the first and the second input/output on and off, wherein the diode and the switch device are connected in series and form elements of a first circuit component which is connected between a gate and a collector of the IGBT, and a cathode of the diode is directed toward the collector and an anode of the diode is directed toward the gate, wherein the switch device is configured to be turned on prior to turn-off of the IGBT to induce desaturation of the IGBT, and wherein a cathode of the diode is conductively connected to an input terminal of a short-circuit monitoring circuit, the desaturation of the IGBT reducing its gate voltage.

21. A desaturation circuit for an IGBT, comprising:
a PID control circuit electrically coupled between a collector and an emitter of the IGBT to a particular nominal value, wherein an output of the PID control circuit is connected to a gate driver circuit for driving the gate and an input of the PID control circuit is connected to an output of a comparison circuit, wherein the comparison circuit is connected at a first one of its inputs to an output of a voltage measuring device for measuring a voltage at the collector and at a second one of its inputs to a reference voltage source outputting the particular nominal value.

22. The desaturation circuit for an IGBT as claimed in claim 21, comprising a switch device for short-circuiting the reference voltage source.

23. An integrated circuit comprising:
a desaturation circuit for an IGBT including:
comprising:
a diode; and
a switch device with a first and a second input/output and a control signal input for turning an electrically conductive connection between the first and the second input/output on and off, wherein the diode and the switch device are connected in series and form elements of a first circuit component which is connected between a gate and a collector of the IGBT, and a cathode of the diode is directed toward the collector and an anode of the diode is directed toward the gate, and wherein the switch device is configured to be turned on prior to turn-off of the IGBT to induce desaturation of the IGBT;
the integrated circuit comprising two semiconductor chips coupled via a coreless transformer.

24. A method for desaturating an IGBT comprising:
operating a desaturation circuit having:
a diode; and
a switch device with a first and a second input/output and a control signal input for turning an electrically conductive connection between the first and the second input/output on and off, wherein the diode and the switch device are connected in series and form elements of a first circuit component which is connected between a gate and a collector of the IGBT, and a cathode of the diode is directed toward the collector and an anode of the diode is directed toward the gate, and wherein the switch device is configured to be turned on prior to turn-off of the IGBT to induce desaturation of the IGBT;

turning the switch device for desaturation and keeping the switch device turned off outside a desaturation period;

determining first energy losses due to an increased collector voltage during the desaturation in dependence on the desaturation period before the turn-off;

determining second energy losses during the turn-off in dependence on the desaturation period of a preceding desaturation; and establishing the desaturation period for the desaturation during an operation of the IGBT at a value at which a sum of first and second energy losses is minimal.

25. A desaturation circuit for an IGBT, comprising:

a diode;

a switch device with a first and a second input/output and a control signal input for turning an electrically conductive connection between the first and the second input/output on and off, wherein the diode and the switch device are connected in series and form elements of a first circuit component which is connected between a gate and a collector of the IGBT, and a cathode of the diode is directed toward the collector and an anode of the diode is directed toward the gate, and wherein the switch device is configured to be turned on prior to turn-off of the IGBT to induce desaturation of the IGBT;

a current-amplifying gate driver circuit is connected in series with the first circuit component as a further circuit component between the first circuit component and the gate, wherein the current-amplifying gate driver circuit has a first supply voltage terminal for a positive pole of a supply voltage source and a second supply voltage terminal for a negative pole of the supply voltage source; and a further switch device is connected between the second supply voltage terminal and a reference point located between the first and further circuit device, wherein the circuit is configured to turn on the further switch device for a shorter period in comparison with a desaturation period at the beginning of desaturation and remains turned off outside this period.

26. A desaturation circuit for an IGBT, comprising:

a PID control circuit for controlling a voltage between a collector and an emitter of the IGBT to a particular nominal value, wherein an output of the PID control circuit is connected to a gate driver circuit for driving the gate and an input of the PID control circuit is connected to an output of a comparison circuit, wherein the comparison circuit is connected at a first one of its inputs to an output of a voltage measuring device for measuring a voltage at the collector and at a second one of its inputs to a reference voltage source outputting the particular nominal value; and a switch device for short-circuiting the reference voltage source, wherein the circuit is configured such that the reference voltage source remains short-circuited by the switch device outside a desaturation period during a conduction phase of the IGBT and is switched to a maximum value lying above possible actual values of the voltage between collector and emitter during a cut-off phase of the IGBT.

27. A desaturation circuit for an IGBT, comprising:

a diode;

means for switching with a first and a second input/output and a control signal input for turning an electrically conductive connection between the first and the second input/output on and off; wherein the diode and the switch means are connected in series and form elements of a first circuit component which is connected between a gate and a collector of the IGBT, and a cathode of the diode is directed toward the collector and an anode of the diode is directed toward the gate, the means for switching being configured to be turned on prior to turn-off of the IGBT to induce desaturation of the IGBT, and wherein a desaturation current flowing from the gate of the IGBT to the collector of the IGBT is passing through the switch device and is turned on and off by the switch device, said desaturation current reducing a gate voltage of the IGBT.

* * * * *